(12) United States Patent
Trask

(10) Patent No.: US 6,400,936 B1
(45) Date of Patent: *Jun. 4, 2002

(54) LOW-NOISE LOSSLESS FEEDBACK DOUBLE-BALANCED ACTIVE MIXERS

(76) Inventor: Christopher Trask, 1863 E. Palmcroft Dr., Tempe, AZ (US) 85282-2858

( * ) Notice: Subject to any disclaimer, the term of this patent is extended or adjusted under 35 U.S.C. 154(b) by 0 days.

This patent is subject to a terminal disclaimer.

(21) Appl. No.: 09/439,662

(22) Filed: Nov. 15, 1999

(51) Int. Cl.$^7$ .............................. H04B 1/26; G06F 7/44
(52) U.S. Cl. ....................... 455/326; 455/333; 327/358; 327/113
(58) Field of Search .................................. 455/326, 333, 455/323, 313; 327/356, 355, 357, 358, 113

(56) References Cited

U.S. PATENT DOCUMENTS

| | | | |
|---|---|---|---|
| 2,337,965 A | 12/1943 | Bode | 333/32 |
| 3,891,934 A | 6/1975 | Norton et al. | 330/296 |
| 5,361,409 A * | 11/1994 | Vice | 455/326 |
| 5,379,457 A * | 1/1995 | Nguyen | 455/326 |
| 5,551,074 A * | 8/1996 | Vice | 455/326 |
| 6,140,849 A * | 10/2000 | Trask | 455/326 |
| 6,172,563 B1 * | 1/2001 | Trask | 330/149 |
| 6,242,964 B1 * | 6/2001 | Trask | 455/326 |
| 6,271,721 B1 * | 8/2001 | Trask | 327/560 |

OTHER PUBLICATIONS

Fong, K.L. and R.G. Meyer, Monolithic Active Mixer Design, IEEE Transactions on Circuits and Systems, vol. 46, No. 3, Mar. 1999, pp. 231–239.

Norton, D.E., "High Dynamic Range Transistor Amplifiers With Lossless Feedback," Microwave Journal, May 1976, pp. 53–57.

Norton, D.E., "High Dynamic Range Transistor Amplifiers Using Losless Feedback, " Proceedings of the 1975 IEEE Int'l Symposium on Circuits and Systems, pp. 438–440.

Sartorf, E.F., "Hybrid Transformers," IEEE Transactions on Parts, Materials, and Packaging, vol. 4, No. 3, Sep. 1968, pp. 59–66.

Trask, C., "A Linearized Active Mixer," Proceedings RF Design 98, San Jose CA, Oct. 1998, pp. 14–23.

Trask, C., "Feedback Technique Improves Active Mixer Performance," RF Design, Sep. 1997, pp. 46–52.

\* cited by examiner

*Primary Examiner*—William Trost
*Assistant Examiner*—Rafael Perez-Gutierrez

(57) ABSTRACT

A low-noise, linearized double-balanced active mixer circuit is described, including a first input for a local oscillator (LO), a second input for an intermediate frequency (IF) signal, and an output for a resulting product radio frequency (RF) signal. The mixer circuit also includes a feedback transformer circuit for the purpose of improving the intermodulation (IM) performance. The lossless nature of the feedback topology gives the active mixer a lower noise figure (NF) characteristic than is realizable with conventional methods. The number of active devices is minimized in order to ensure that the mixer attains the lowest possible NF.

7 Claims, 3 Drawing Sheets

LOW-NOISE LOSSLESS FEEDBACK DOUBLE-BALANCED ACTIVE MIXERS

BACKGROUND OF THE INVENTION

Mixers are used in communications circuits for the purpose of generating a modulated carrier for transmission, demodulating a modulated carrier in reception, or converting a signal at some input intermediate frequency (IF) to another output radio frequency (RF) by multiplying two input signals and thereby generating a third. A number of mixer realizations, both passive and active, are known in the art, and double-balanced mixers are known particularly well due to their advantages in the suppression of unwanted spurious signals and the isolation of any one of three ports to the other two, there generally being two inputs and one output. The Gilbert Cell has been the most widely used active mixer circuit for performing the above tasks, usually incorporated within an integrated circuit. It does, however, possess certain limitations in terms of intermodulation (IM) distortion and noise figure (NF) that precludes it's use in communications systems having demanding performance specifications. The series-shunt feedback mixer delivers a much improved IM performance, but the lossy nature of the feedback topology does not improve the NF performance. The lossless feedback mixer offers an improvement in noise figure, and this performance can be further improved by a simple modification.

Referring to FIG. 1, a schematic diagram of a lossless feedback double-balanced active mixer is shown in functional form. Here, the mixer is comprised of switching transistors 101, 102, 104, and 105, which are turned on (saturation) and off (cutoff) alternately by a differentially applied local oscillator (LO) signal. By this switching action, a pair of currents generated by driver transistors 103 and 106 are divided into four paths, there being two paths for each of two currents. The currents generated by driver transistors 103 and 106 are the result of an input intermediate frequency (IF) signal applied differentially to the input windings of a pair of feedback transformers 107 and 108. The hybrid transformers 111 and 112 combine the four currents from switching transistors 101, 102, 104, and 105, creating a differential pair of feedback currents 119 and 120, as well as an output RF signal 121. The feedback currents 119 and 120 are coupled to the output windings of feedback transformers 107 and 108, respectively, thereby forming a pair of lossless feedback amplifiers which serve to establish the conversion gain and improve the IM performance of the mixer.

Those familiar with the art will readily understand that the improved NF performance of the lossless feedback double-balanced active mixer is a result of the lack of additional noise sources in the embedding topology. This active mixer offers considerable advantages over the more traditional Gilbert Cell active mixer, especially in terms of signal-handling and performance variations over temperature due to the temperature dependency of the emitter resistance $r_e$ of the driver transistors, and the tradeoffs that are encountered in receiver and transmitter system design. It further provides an improvement in NF over the Gilbert Cell mixer and the series-shunt feedback mixer.

It is the purpose of this invention to further advance the art of feedback mixers by addressing the sources of noise present in the lossless feedback double-balanced active mixer, and to therefore provide an active mixer of substantially improved NF performance, while at the same time retaining the desireable power consumption, IM performance, and overall sense of simplicity and cost effectiveness of the lossless feedback double-balanced active mixer.

SUMMARY OF THE INVENTION

A lossless feedback double-balanced active mixer circuit with improved intermodulation (IM) and noise figure (NF) performance is described which includes a pair of lossless feedback balanced active mixer circuits, each of which includes a differential pair of switching transistors which divide a controlled current into two paths at a rate determined by an input local oscillator (LO). A hybrid transformer in each lossless feedback balanced mixer, consisting of a centre-tapped primary winding and a secondary winding, combines the two currents to provide a recombined amplified IF signal and an output radio frequency (RF) signal. The controlled current is provided by an input intermediate frequency (IF) signal and its relation with the lossless feedback mixer input impedance. Each lossless feedback active mixer circuit further includes a feedback transformer, comprised of an input winding and a tapped output winding, which compares the input IF signal with the recombined amplified IF signal from the hybrid transformers and applies the difference as a correction to the input current, thereby completing a lossless feedback amplifier circuit which improves the IM performance of the mixer circuit. Since the feedback transformer is essentially lossless, it introduces no significant sources of noise to the active mixer circuit, and therefore the NF of the of the lossless feedback active mixer circuit remains unimpaired beyond the NF of the transistors themselves. The NF of the lossless feedback double-balanced active mixer is further improved by minimizing the number of active devices. The connection of the secondary windings of the hybrid transformers of the lossless feedback active mixer circuits effectively cancels the output LO and IF signals and provides and output RF signal.

BRIEF DESCRIPTION OF THE DRAWINGS

The invention is described in the schematics of FIGS. 1 to 3, in which.

DETAILED DESCRIPTION OF THE PREFERRED EMBODIMENT

Designers of radio communication receivers are always concerned with elements of system performance which includes, but is not limited to, intermodulation distortion (IM), noise figure (NF), and power consumption. Historically, the IM performance of communications receivers is improved by methods that invariably require additional power consumption. Amplification stages with feedback methods are widely used as they offer far better IM performance while consuming less power than those not employing feedback. The NF of communications receivers is determined by the NF performance of the first stages of the receiver, which usually have sufficiently low NF and suitable signal gain to overcome the IM and NF performance of the first mixer stage, which is traditionally the primary source of distortion and noise. This invention now presents a mixer circuit which achieves a markedly improved IM and NF performance without excessive power consumption by applying a feedback method widely used in amplifier design which introduces no significant noise sources in addition to those of the active devices themselves. In addition, this invention removes a significant source of noise from prior embodiments.

Figure 1:
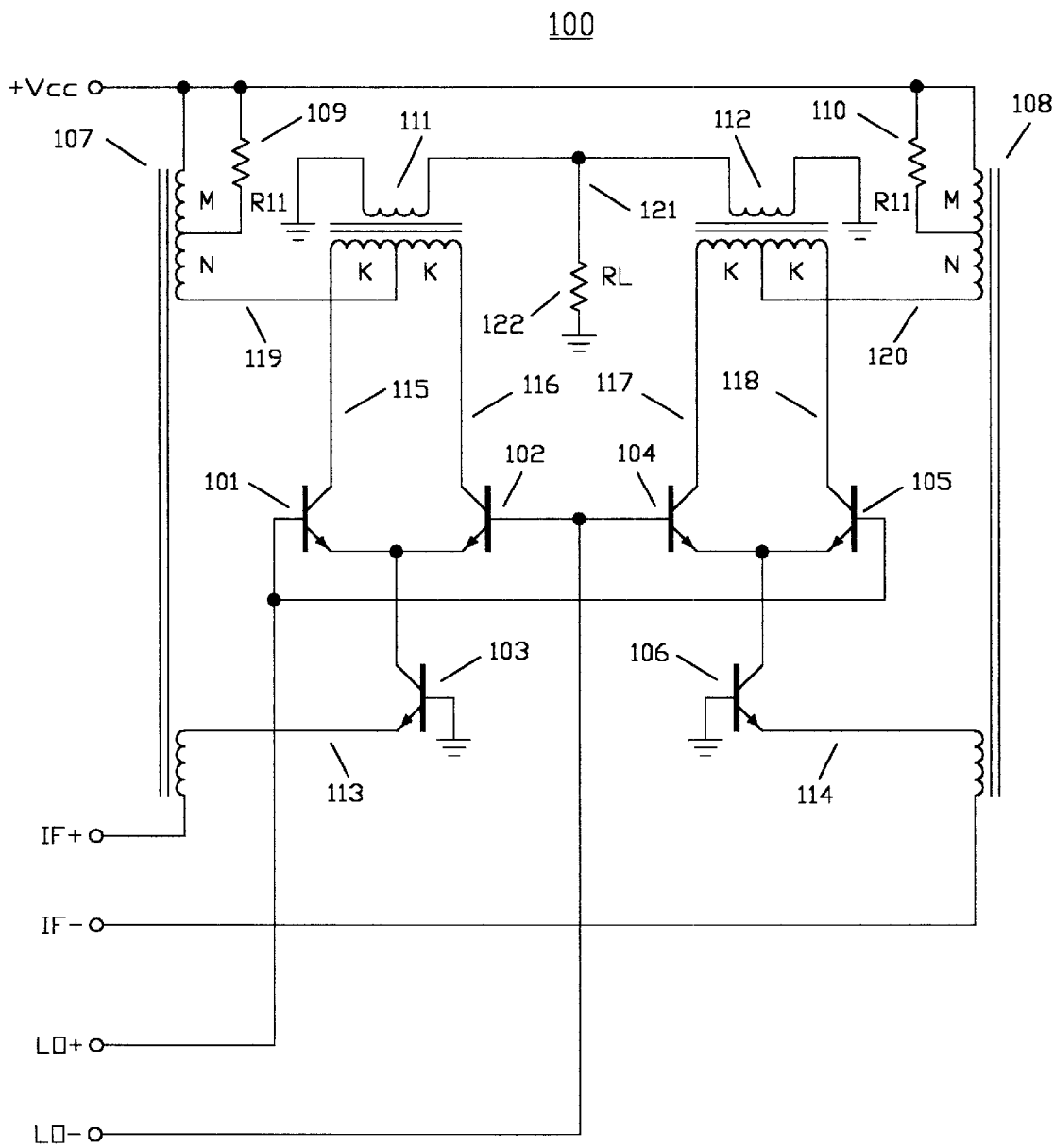
FIG. 1 schematically illustrates the existing prior art, commonly referred to as a lossless feedback double-balanced active mixer.

A typical lossless feedback double-balanced active mixer circuit 100 is shown in FIG. 1. Here, transistor 103 and transformer 107 form a lossless feedback amplifier on the left side, while transistor 106 and transformer 108 form a lossless feedback amplifier on the right side. Transistors 101 and 102 form a chopper for the left side and transistors 104 and 105 form a chopper for the right side. Hybrid transformer 111 combines currents 115 and 116 from transistors 101 and 102, the sum of which appears at a centre tap while the difference appears at a secondary winding. A similar description can be made for the second hybrid transformer 112 on the right side. A differential input Intermediate Frequency (IF) signal connected to the input windings of transformers 107 and 108 generates a differential pair of input currents 113 and 114:

$$I_{113} = I_Q + \frac{A \times \cos\omega_S t}{R_{in}} \quad (1)$$

$$I_{114} = I_Q - \frac{A \times \cos\omega_S t}{R_{in}} \quad (2)$$

where $\omega_S$ is the frequency and A is the amplitude of the input IF signal, $I_Q$ is the quiescent bias current, and $R_{in}$ is the input resistance which is defined as:

$$R_{in} = \frac{M+N+1}{M^2} \times R_{11} \quad (3)$$

where M and N are the turns ratios of the output windings of transformers 107 and 108. These input currents are conducted to the emitters of a pair of driver transistors 103 and 106, respectively, which in turn conduct the current to a first differential pair of switching transistors 101 and 102 and a second differential pair of switching transistors 104 and 105. A Local Oscillator (LO) signal applied differentially across the base terminals of the differential switching transistor pairs results in two differential pairs of output currents:

$$I_{115} = I_{113} \times \frac{1 - \cos\omega_L t}{2} = \frac{I_Q \times (1 - \cos\omega_L t)}{2} + \frac{A \times \left[\cos\omega_S t - \frac{\cos(\omega_S - \omega_L)t + \cos(\omega_S + \omega_L)t}{2}\right]}{2 \times R_{in}} \quad (4)$$

$$I_{116} = I_{113} \times \frac{1 + \cos\omega_L t}{2} = \frac{I_Q \times (1 + \cos\omega_L t)}{2} + \frac{A \times \left[\cos\omega_S t + \frac{\cos(\omega_S - \omega_L)t + \cos(\omega_S + \omega_L)t}{2}\right]}{2 \times R_{in}} \quad (5)$$

$$I_{117} = I_{114} \times \frac{1 + \cos\omega_L t}{2} = \frac{I_Q \times (1 + \cos\omega_L t)}{2} - \frac{A \times \left[\cos\omega_S t + \frac{\cos(\omega_S - \omega_L)t + \cos(\omega_S + \omega_L)t}{2}\right]}{2 \times R_{in}} \quad (6)$$

$$I_{118} = I_{114} \times \frac{1 - \cos\omega_L t}{2} = \frac{I_Q \times (1 - \cos\omega_L t)}{2} - \frac{A \times \left[\cos\omega_S t - \frac{\cos(\omega_S - \omega_L)t + \cos(\omega_S + \omega_L)t}{2}\right]}{2 \times R_{in}} \quad (7)$$

where $\omega_S$ is the frequency of the input LO signal.

Figure 2:
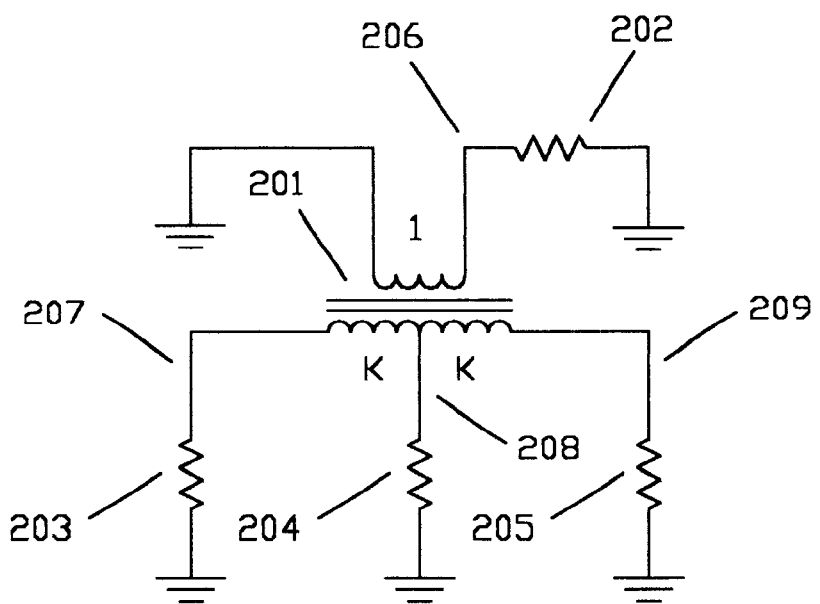
FIG. 2 schematically illustrates a hybrid transformer.

Referring now to FIG. 2, a circuit 200 is used as an aid in describing the impedances, voltages, and currents of the four ports of a hybrid transformer 201, which are:

$$R_{204} = K^2 \times R_{202} \quad (8)$$

$$R_{203} = R_{205} = 2 \times R_{204} \quad (9)$$

$$I_{206} = K \times (I_{209} - I_{207}) \quad (10)$$

$$I_{208} = I_{209} + I_{207} \quad (11)$$

$$V_{206} = \frac{V_{209} - V_{207}}{2 \times K} \quad (12)$$

$$V_{208} = \frac{V_{209} + V_{207}}{2} \quad (13)$$

If both hybrid transformers 111 and 112 have turns ratios of 1:1:1 (K=1), then the currents at the center taps of the hybrid transformers 111 and 112 are, respectively:

$$I_{119} = I_{115} + I_{116} = I_Q + \frac{A \times \cos\omega_S t}{R_{in}} \quad (14)$$

$$I_{120} = I_{117} + I_{118} = I_Q - \frac{A \times \cos\omega_S t}{R_{in}} \quad (15)$$

and the output signal current conducted to the load resistance $R_L$ is:

$$i_{121} = K \times (I_{115} - I_{116}) - K \times (I_{117} - I_{118}) = 2 \times A \times K^2 \times \frac{\cos(\omega_S - \omega_L)t + \cos(\omega_S + \omega_L)t}{R_{in}} \quad (16)$$

which makes the output signal voltage equal to:

$$v_{121} = 2 \times A \times K^2 \times R_L \times \frac{\cos(\omega_S - \omega_L)t + \cos(\omega_S + \omega_L)t}{R_{in}} \quad (17)$$

If the gain and output noise power of the driver transistors is constant across all frequencies, the square-wave switching process of the differential switching transistors would increase the input-referred noise contribution from the driver stage by a factor of $(\pi/2)^2$, or 3.9 dB. This is a result of the square-wave LO mixing noise at various IF (of RF) frequencies up to the RF (or down to the IF), and on a linear scale the overall noise power of the mixer would be:

$$NF = N_D \times (\pi/2)^2 + N_{SW} \quad (18)$$

where $N_{SW}$ is the noise contribution from the first differential switching pair 101 and 102 and the second differential switching pair 104 and 105, and $N_D$ is the input-referred noise of the driver transistors 103 and 106, which consists of base shot noise ($N_b$), collector shot noise ($N_c$), and thermal noise ($N_t$):

$$N_D = 1 + N_c + N_b + N_t \quad (19)$$

By examination of EQ. 18, if the sources of noise attributed to the driver transistors 103 and 106, as described in EQ. 19, were to be reduced or eliminated, the NF of the lossless feedback double-balanced active mixer would be reduced to the NF of the differential pair switching transistors 101, 102, 104, and 105.

Here it should be noted that differential switching transistors 101 and 102, driver transistor 103, hybrid transformer 111, and feedback transformer 107 form a first lossless feedback balanced active mixer circuit. Switching transistors 104 and 105, driver transistor 106, hybrid transformer 112, and feedback transformer 108 forma a second lossless feedback balanced active mixer circuit. The lossless feedback double-balanced active mixer circuit 100 is formed by the combination of the first lossless feedback balanced active mixer circuit with the second lossless feedback balanced active mixer circuit.

Figure 3:
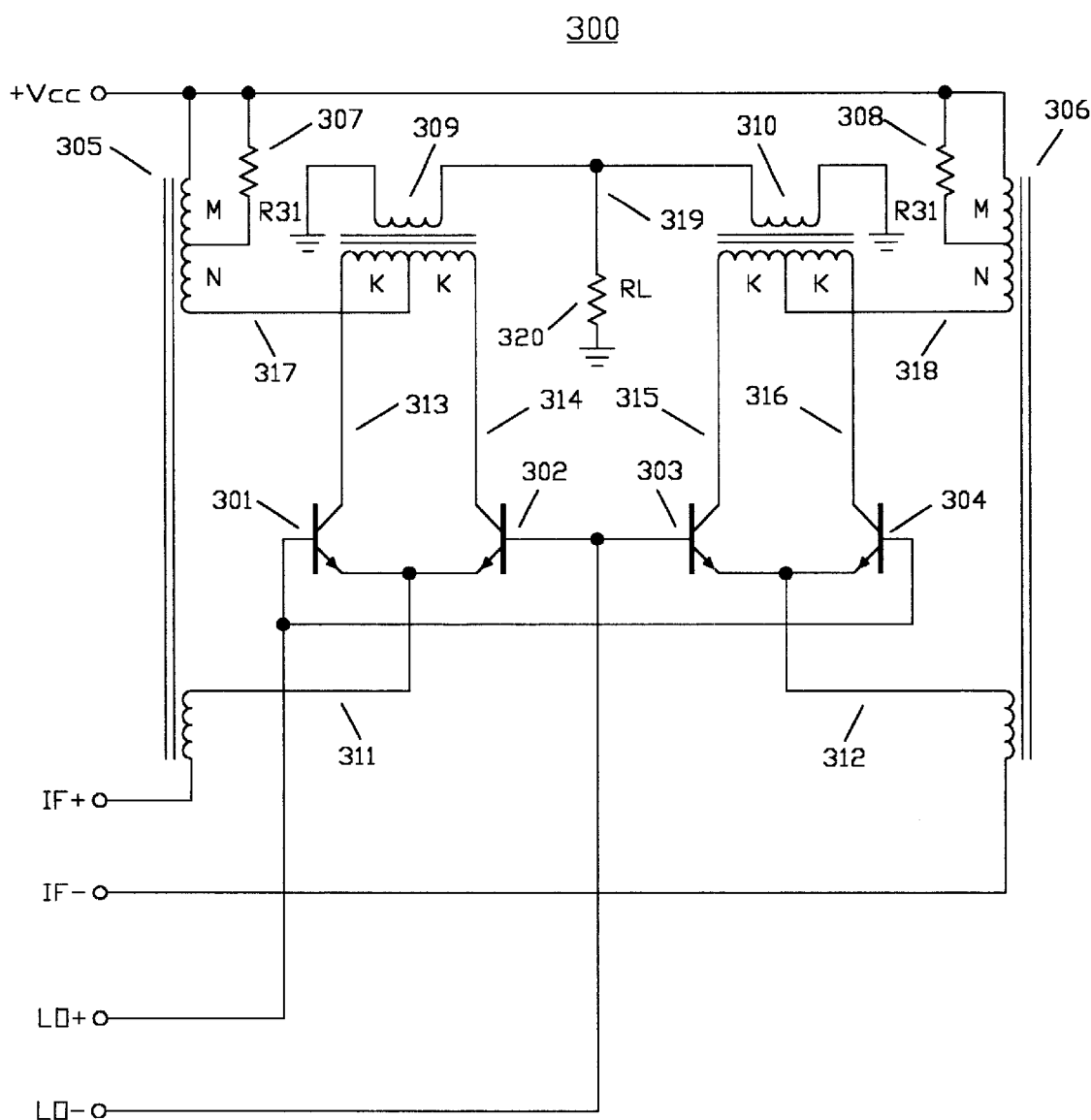
FIG. 3 schematically illustrates a low-noise lossless feedback double-balanced active mixer in accordance with the present invention.

Referring now to FIG. 3, a lossless feedback double-balanced active mixer circuit 300 in accordance with the present invention is illustrated. Mixer circuit 300 includes a first pair of switching transistors 301 and 302 and a second pair of switching transistors 303 and 304. The emitters of switching transistors 301 and 302 are connected in common to one end of an input winding of a first lossless feedback transformer 305, the opposite end of which is connected to receive one of a complementary pair of IF signals thereon. The emitters of switching transistors 303 and 304 are connected in common to one end of an input winding of a second lossless feedback transformer 306, the opposite end of which is connected to receive the other of the complementary pair of IF signals thereon. The bases of switching transistors 301 and 304 are connected together to receive one of a complementary pair of local oscillator signals thereon. The bases of switching transistors 302 and 303 are connected together to receive the other of the complementary pair of local oscillator signals thereon.

The collectors of switching transistors 301 and 302 are connected to opposite sides of a primary winding of a first hybrid transformer 309. A centre tap of the primary winding is connected to one end of an output winding of lossless feedback transformer 305. The opposite end of the output winding is connected to a voltage source $V_{cc}$ and a tap of the output winding is connected through a load resistance 307 (illustrated as a fixed resistance $R_{31}$ for convenience) to voltage source $V_{cc}$. The collectors of switching transistors 303 and 304 are connected to opposite sides of a primary winding of a hybrid transformer 310. A centre tap of the primary winding is connected to one end of an output winding of lossless feedback transformer 306. The opposite end of the output winding is connected to a voltage source $V_{cc}$ and a tap of the output winding is connected through a load resistance 308 (illustrated as a fixed resistance $R_{31}$ for convenience) to voltage source $V_{cc}$. An RF output terminal 319 is connected through a secondary winding of hybrid transformer 309 to ground, through a secondary winding of hybrid transformer 310 to ground, and through a load resistance 320 (illustrated as a fixed resistance $R_L$ for convenience) to ground.

Thus, a first low-noise lossless feedback balanced active mixer circuit includes switching transistors 301 and 302, hybrid transformer 309, and feedback transformer 305 and a second low-noise lossless feedback balanced active mixer circuit includes switching transistors 303 and 304, hybrid transformer 310, and feedback transformer 306. Further, the low-noise lossless feedback double-balanced active mixer circuit 300 is formed by the combination of the first low-noise lossless feedback balanced active mixer circuit and the second low-noise lossless feedback balanced active mixer circuit.

The input impedance of mixer circuit 300, as seen at either of the IF input ports, is determined from the value of the resistors 307 and 308, as well as the turns ratios M and N of the lossless feedback transformers 305 and 306:

$$R_{in} = \frac{M+N+1}{M^2} \times R_{31} \tag{20}$$

It is necessary that the impedance of the centre tap of hybrid transformers 309 and 310 be matched to the collector load impedance of the lossless feedback transformers 305 and 306, respectively:

$$R_{317} = (M+N) \times R_{31} = 2 \times K^2 \times R_L \tag{21}$$

$$R_{31} = \frac{2 \times K^2 \times R_L}{M+N} \tag{22}$$

which forces the IF input impedance of both sides of the double-balanced lossless feedback active mixer circuit to be:

$$R_{in} = \frac{2 \times K^2 \times R_L \times (M+N+1)}{M^2 \times (M+N)} \tag{23}$$

These conditions being satisfied, the input currents to the common emitter of the first differential switching transistor pair 301 and 302 and the second differential switching transistor pair 303 and 304 are, respectively:

$$I_{311} = I_Q + \frac{A \times \cos\omega_S t}{R_{in}} \tag{24}$$

$$I_{312} = I_Q - \frac{A \times \cos\omega_S t}{R_{in}} \tag{25}$$

where $I_Q$ is the quiescent bias current, and A and $\omega_S$ are the amplitude and frequency, respectively, of the input IF (or RF) signal voltage. The current at the collectors of switching transistors 301, 302, 303, and 304 are, respectively:

$$I_{313} = I_{311} \times \frac{1-\cos\omega_L t}{2} = \frac{I_Q \times (1-\cos\omega_L t)}{2} + \frac{A \times \left[\cos\omega_S t - \frac{\cos(\omega_S - \omega_L)t + \cos(\omega_S + \omega_L)t}{2}\right]}{2 \times R_{in}} \tag{26}$$

$$I_{314} = I_{311} \times \frac{1+\cos\omega_L t}{2} = \frac{I_Q \times (1+\cos\omega_L t)}{2} + \frac{A \times \left[\cos\omega_S t + \frac{\cos(\omega_S - \omega_L)t + \cos(\omega_S + \omega_L)t}{2}\right]}{2 \times R_{in}} \tag{27}$$

$$I_{315} = I_{312} \times \frac{1+\cos\omega_L t}{2} = \frac{I_Q \times (1+\cos\omega_L t)}{2} - \frac{A \times \left[\cos\omega_S t + \frac{\cos(\omega_S - \omega_L)t + \cos(\omega_S + \omega_L)t}{2}\right]}{2 \times R_{in}} \tag{28}$$

$$I_{316} = I_{312} \times \frac{1-\cos\omega_L t}{2} = \frac{I_Q \times (1-\cos\omega_L t)}{2} - \frac{A \times \left[\cos\omega_S t - \frac{\cos(\omega_S - \omega_L)t + \cos(\omega_S + \omega_L)t}{2}\right]}{2 \times R_{in}} \tag{29}$$

The currents at the centre taps of hybrid transformers 309 and 310 are, respectively:

$$I_{317} = I_{313} + I_{314} = I_Q + \frac{A \times \cos\omega_S t}{R_{in}} \quad (30)$$

$$I_{318} = I_{315} + I_{316} = I_Q - \frac{A \times \cos\omega_S t}{R_{in}} \quad (31)$$

and the current is:

$$i_{319} = K \times (I_{313} - I_{314}) - K \times (I_{315} - I_{316}) = \quad (32)$$

$$2 \times A \times K^2 \times \frac{\cos(\omega_S - \omega_L)t + \cos(\omega_S + \omega_L)t}{R_{in}}$$

which makes the output voltage equal to:

$$v_{319} = 2 \times A \times K^2 \times R_L \times \frac{\cos(\omega_S - \omega_L)t + \cos(\omega_S + \omega_L)t}{R_{in}} \quad (33)$$

which is identical to EQ. 16 and EQ. 17, respectively, showing that the low-noise lossless feedback double-balanced active mixer circuit 300 has the same conversion gain properties as the lossless double-balanced active mixer circuit 100 while the sources of noise have been substantially reduced.

Although detailed embodiments of the invention have been described, it should be appreciated that numerous modifications, variations, and adaptations may be made without departing from the scope of the invention as described in the claims. For example, those familiar with the art will recognize that the bipolar transistors shown in the embodiments may be alternatively replaced with field effect transistors. Also, the single-transformer lossless feedback topology shown in the embodiments may be alternatively replaced with other forms of lossless feedback that are known to the art.

Further, while the terminals of the bipolar transistors described in the various embodiments are referred to as the emitter, base, and collector, it will be understood that these terminals will be the source, gate, and drain when the transistors utilized are field effect transistors or other similar types and may be referred to as input, control, and output terminals, respectively, however the titles of the various components and terminals are only intended to enhance the understanding of the disclosure and are not intended to in any way limit the type of component utilized. In addition, it should be understood that the terms "lossless feedback transformer" and "hybrid transformer" used throughout this disclosure refer to general types of transformers and should not be limited in any way to specific types of transformers.

What is claimed is:

1. A low-noise lossless feedback double-balanced active mixer circuit for mixing an input intermediate frequency (IF) signal and an input local oscillator (LO) signal and producing an output radio frequency (RF) signal consisting of:

a pair of IF input terminals for receiving differential first and second IF signals, the first IF signal input terminal receiving the first IF input signal and the second IF signal input terminal receiving the second IF input signal;

a pair of LO input terminals for receiving differential first and second LO input signals;

an RF output terminal for providing an RF output signal;

a first low-noise lossless feedback balanced active mixer circuit having an IF signal input coupled to the first IF signal input terminal, first and second differential LO signal inputs coupled to the pair of LO input terminals, a first differential pair of transistors having a signal input, a differential pair of LO inputs coupled to the first and second differential LO signal inputs, and a differential pair of outputs coupled through a first hybrid transformer to an RF output connected to the RF output terminal, the first hybrid transformer further providing a first amplified IF output, and a first lossless feedback transformer coupling the first IF signal input and the first amplified IF output of the first hybrid transformer to the input of the first differential pair of transistors; and a second low-noise lossless feedback balanced active mixer circuit having an IF signal input coupled to the second IF signal input terminal, first and second differential LO signal inputs coupled to the pair of LO input terminals, a second differential pair of transistors having a signal input, a differential pair of LO inputs coupled to the first and second differential LO signal inputs, and a differential pair of outputs coupled through a second hybrid transformer to an RF output coupled to the RF output terminal, the second hybrid transformer further providing a second amplified IF output, and a second lossless feedback transformer coupling the second IF signal input and the second amplified IF output of the second hybrid transformer to the input of the second differential pair of transistors.

2. A low-noise lossless feedback double-balanced active mixer circuit for mixing an input intermediate frequency (IF) signal and an input local oscillator (LO) signal and producing an output radio frequency (RF) signal comprising:

a pair of IF input terminals for receiving differential first and second IF input signals, including a first IF signal input terminal for receiving the first IF input signal and a second IF signal input terminal for receiving the second IF input signal;

a pair of LO input terminals for receiving differential first and second LO input signals;

an RF output terminal for providing an RF output signal;

a first low-noise lossless feedback balanced active mixer circuit having an IF signal input connected to the first IF signal input terminal of the low-noise lossless feedback double-balanced active mixer circuit, a first and second differential LO signal inputs connected one each to the pair of LO input terminals of the low-noise lossless feedback double-balanced active mixer circuit, and an RF signal output connected to the RF output terminal of the low-noise lossless feedback double-balanced active mixer circuit; and a second low-noise lossless feedback balanced active mixer circuit having an IF signal input connected to the second IF signal input terminal of the low-noise lossless feedback double-balanced active mixer circuit, a first and second differential LO signal inputs connected one each to the pair of LO input terminals of the low-noise lossless feedback double-balanced active mixer circuit, and an RF signal output connected to the RF output terminal of the low-noise lossless feedback double-balanced active mixer circuit.

3. A low-noise lossless feedback double-balanced active mixer circuit, as claimed in claim 2, wherein each of the low-noise lossless feedback balanced active mixer circuits consists of a hybrid transformer, having a primary winding with a first and second end and a centre-tap, and a secondary winding with a first and second end, the first end of the secondary winding being coupled to the RF signal output of the low-noise lossless feedback balanced active mixer circuit and the second end of the secondary winding coupled to a signal ground;

a differential pair of transistors having a differential pair of collector terminals, a differential pair of base terminals, and a common emitter terminal, the differential collector terminals coupled to the first and second ends of the hybrid transformer primary winding respectively, the differential pair of base terminals coupled to the pair of LO input terminals of the low-noise lossless feedback balanced active mixer circuit;

a lossless feedback transformer having a first input winding and a second output winding, the first end of the input winding coupled to the IF input terminal of the low-noise lossless feedback balanced active mixer circuit and the second end of the input winding coupled to the common emitter terminal of the differential pair of transistors, the first end of the output winding coupled to the centre-tap of the hybrid transformer primary winding, and the second end of the output winding coupled to a signal ground; and a load resistance, the first end coupled to the first end of the feedback transformer output winding and the centre tap of the hybrid transformer primary winding, and the second end coupled to a signal ground.

4. A low-noise lossless feedback double-balanced active mixer circuit, as claimed in claim 2, wherein each of the low-noise lossless feedback balanced active mixer circuits consists of a hybrid transformer, having a primary winding with a first and second end and a centre-tap, and a secondary winding with a first and second end, the first end of the secondary winding being coupled to the RF signal output of the low-noise lossless feedback balanced active mixer circuit and the second end of the secondary winding coupled to a signal ground;

a differential pair of transistors having a differential pair of collector terminals, a differential pair of base terminals, and a common emitter terminal, the differential collector terminals coupled to the first and second ends of the hybrid transformer primary winding respectively, the differential pair of base terminals coupled to the pair of LO input terminals of the low-noise lossless feedback balanced active mixer circuit;

a lossless feedback transformer having a first input-winding and a second tapped output winding, the first end of the input winding coupled to the IF input terminal of the low-noise lossless feedback balanced active mixer circuit and the second end of the input winding coupled to the common emitter terminal of the differential pair of transistors, the first end of the output winding coupled to the centre-tap of the hybrid transformer primary winding, and the second end of the output winding coupled to signal ground; and a load resistance, the first end coupled to the tap of the feedback transformer output winding and the second end coupled to a signal ground.

5. A method of combining an input intermediate frequency (IF) signal and an input local oscillator (LO) signal to provide a low-noise, linearized output radio frequency (RF) signal comprising the steps of:

providing differential first and second IF input signals;

providing differential LO input signals;

combining the first IF input signal and the differential LO input signals by a first differential mixing means to produce differential first and second RF signals;

combining the second IF input signal and the differential LO input signals by a second differential mixing means to produce differential third and fourth RF signals;

combining the first, second, third, and fourth RF signals to produce an RF output signal;

combining the first, second, third, and fourth RF signals to produce a pair of first and second IF feedback signals;

combining the first IF feedback signal with the first IF input signal in a lossless network to provide a noise-free correction for linearizing the first and second differential RF signals; and combining the second IF feedback signal with the second IF input signal in a lossless network to provide a noise-free correction for linearizing the third and fourth differential RF signals.

6. A method of combining an input intermediate frequency (IF) signal and an input local oscillator (LO) signal to provide a low-noise linearized output radio frequency (RF) signal as claimed in claim 5 wherein the step of combining the first, second, third, and fourth RF signals to produce a first and second IF feedback signal consists of combining the first and second RF signals to produce the first IF feedback signal and combining the third and fourth RF signals to produce the second IF feedback signal.

7. A method of combining an input intermediate frequency (IF) signal and an input local oscillator (LO) signal to provide a low-noise linearized output radio frequency (RF) signal as claimed in claim 5 wherein the first and second differential mixing means each consist of a differential pair of transistors.

* * * * *